(12) United States Patent
Lin et al.

(10) Patent No.: US 12,106,800 B2
(45) Date of Patent: Oct. 1, 2024

(54) ADAPTIVE WORD LINE CONTROL CIRCUIT

(71) Applicant: Taiwan Semiconductor Manufacturing Company, Ltd., Hsinchu (TW)

(72) Inventors: Chien-Chen Lin, Kaohsiung (TW); Pei-Yuan Li, New Taipei (TW); Hsiang-Yun Lin, Taichung (TW); Shang Lin Wu, Hsinchu County (TW); Wei Min Chan, Sindian (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 103 days.

(21) Appl. No.: 17/673,025

(22) Filed: Feb. 16, 2022

(65) Prior Publication Data

US 2023/0260570 A1    Aug. 17, 2023

(51) Int. Cl.
G11C 11/418    (2006.01)
G11C 11/412    (2006.01)
G11C 11/419    (2006.01)

(52) U.S. Cl.
CPC .......... *G11C 11/418* (2013.01); *G11C 11/412* (2013.01); *G11C 11/419* (2013.01)

(58) Field of Classification Search
CPC ... G11C 11/412; G11C 11/418; G11C 11/419; G11C 8/08
USPC ......................................................... 365/154
See application file for complete search history.

(56) References Cited

U.S. PATENT DOCUMENTS 5,808,954 A * 9/1998 Ichikawa ................. G11C 8/08
327/535

\* cited by examiner

*Primary Examiner* — Alexander Sofocleous
*Assistant Examiner* — Tracy R Hampton
(74) *Attorney, Agent, or Firm* — FOLEY & LARDNER LLP

(57) ABSTRACT

Disclosed herein are related to memory device including an adaptive word line control circuit. In one aspect, the memory device includes a memory cell and a word line driver coupled to the memory cell through a word line. In one aspect, the memory device includes an adaptive word line control circuit including two or more diodes connected in series, where one of the two or more diodes is coupled to the word line.

8 Claims, 10 Drawing Sheets

800

Detect a voltage output of a word line driver coupled a memory cell
810

Determine whether the voltage output exceeds a threshold value
820

Selectively reduce the voltage output, according to the determination
830

Fig. 8

ADAPTIVE WORD LINE CONTROL CIRCUIT

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided, but may lose the stored data once the power is shut off. Unlike volatile memory devices, non-volatile memory devices may retain data even after the power is shut off, but may be slower than the volatile memory devices. A word line driver may be implemented to provide a voltage to one or more memory cells through a word line to write data to or read data from the one or more memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flowchart of adaptively adjusting a voltage output of a word line driver, in accordance with some embodiments.

DETAILED DESCRIPTION

Figure 1:
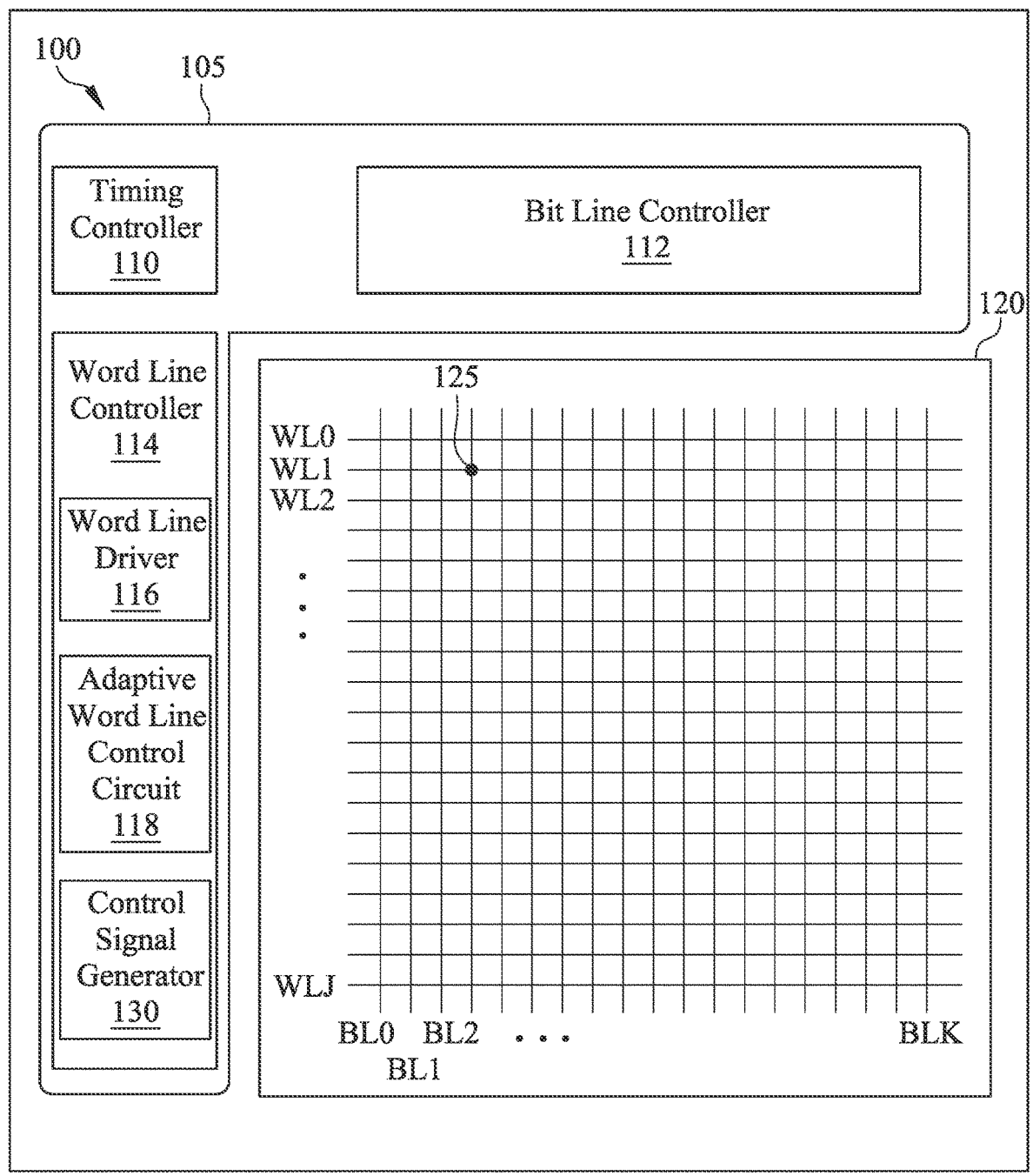
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a memory device with an adaptive word line control circuit. In some embodiments, the memory device includes a memory cell and a word line driver coupled to the memory cell through a word line. In some embodiments, the memory device includes an adaptive word line control circuit including two or more diodes connected in series, where one of the two or more diodes is coupled to the word line.

In one aspect, the adaptive word line control circuit can selectively reduce a voltage output of the word line driver. For example, the adaptive word line control circuit reduces a voltage output of the word line driver for a first voltage range of the voltage output of the word line driver and bypasses or omits reducing the voltage output of the word line driver for a second voltage range of the voltage output of the word line driver.

Advantageously, the disclosed adaptive word line control circuit can improve a stability of operation of the memory device without lowering an operating speed (or reading speed) of the memory device. In one example, a high voltage output from the word line driver above a threshold value (e.g., 0.6~1.0V) may cause a bit flip, and cause error when reading data stored by the memory cell. In one implementation, a voltage suppression circuit or an under drive circuit can be implemented to reduce a voltage output of the word line driver. However, reducing or suppressing a low voltage output of the word line driver below a threshold value (e.g., 0.6~1.0V) can slow down the operating speed (or reading speed) of the memory device. In one aspect, the adaptive word line control circuit can reduce a voltage output of the word line driver for a first voltage range of the voltage output of the word line driver above a threshold value. Meanwhile, the adaptive word line control circuit may not reduce the voltage output of the word line driver for a second voltage range of the voltage output of the word line driver below the threshold value. Accordingly, the stability of the memory device can be improved by reducing the voltage output of the word line driver in the first range. Moreover, an operating speed of the memory device may not be compromised by not reducing the voltage output of the word line driver in the second range.

In one aspect, the adaptive word line control circuit includes two or more diodes connected in series to selectively reduce the voltage output of the word line driver. In one aspect, the threshold value may correspond to a sum of threshold voltages of the two or more diodes. For example, the two or more diodes may conduct current to reduce the voltage output of the word line driver, if the voltage output of the word line driver exceeds a sum of the threshold voltages of the two or more diodes. For example, the two or more diodes may not conduct current to omit or bypass reducing the voltage output of the word line driver, if the voltage output of the word line driver does not exceed the sum of the threshold voltages of the two or more diodes. By implementing the adaptive word line control circuit with two or more diodes connected in series, the adaptive word line control circuit can be implemented in a simple architecture with a small form factor without a complex feedback circuit or a sensing circuit.

In one aspect, the adaptive word line control circuit can selectively reduce the voltage output of the word line driver for a brief time period to improve the operating speed (e.g., reading speed) of the memory device. Reducing the voltage output of the word line driver can help improve stability of the memory device, but may lower the operating speed of the memory device. In one aspect, the word line driver receives a pulse having a first state during a first time period and a second state during a second time period. The adaptive word line control circuit can be enabled during a third time period within the first time period to reduce the voltage output of the word line driver during the third time period. During a fourth time period remaining after the third time period within the first time period, the adaptive word line control circuit can be disabled to not reduce the voltage output of the word line driver. Applying a high voltage output from the word line driver to the memory cell can help improve the operating speed. In one aspect, a high voltage output can cause a bit flip during the third time period, because a voltage difference in the memory cell may not be large enough. Meanwhile, the high voltage output may not cause the bit flip during the fourth time period, because the voltage difference in the memory cell during the fourth time period may be large enough to overcome or withstand any effect (e.g., capacitive coupling or voltage division) due to the high voltage output. Therefore, the adaptive word line control circuit can be enabled for a brief time period (e.g., third time period) to prevent a bit flip, and disabled after the brief time period (e.g., third time period) to improve operating speed of the memory device.

In some embodiments, one or more components can be embodied as one or more transistors. The transistors in this disclosure are shown to have a certain type (N-type or P-type), but embodiments are not limited thereto. The transistors can be any suitable type of transistor including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two or three dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one aspect, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. The bit line controller 112, the word line controller 114, and the timing controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the timing controller 110 may generate control signals to coordinate operations of the bit line controller 112 and the word line controller 114. For example, the timing controller 110 may generate one or more enable signals to enable or disable operations of the bit line controller 112 and/or the word line controller 114. In one approach, to write data to a memory cell 125, the timing controller 110 may cause the word line controller 114 to apply a voltage or current to the memory cell 125 through a word line WL coupled to the memory cell 125, and cause the bit line controller 112 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125, and cause the bit line controller 112 to sense a voltage or current corresponding to data stored by the memory cell 125 through a bit line BL coupled to the memory cell 125.

In some embodiments, the word line controller 114 includes a word line driver 116, an adaptive word line control circuit 118, and a control signal generator 130. These components may operate together to generate a voltage or a pulse to apply to a word line WL coupled to a selected memory cell 125. In some embodiments, the word line controller 114 includes more, fewer, or different components than shown in FIG. 1. In some embodiments, the word line controller 114 includes multiples of the word line driver 116, the adaptive word line control circuit 118, and/or the control signal generator 130.

The word line driver 116 is a circuit or a component that receives a voltage input or an input pulse, and generates an output voltage or an output pulse, according to the voltage input or the input pulse. The word line driver 116 may be coupled one or more word lines WL. The word line driver 116 may be embodied as an amplifier circuit or any driver circuit. The word line driver 116 can generate different voltage outputs or pulses having different voltage amplitudes for different operations. For example, the word line driver 116 may apply different voltage outputs for performing a read operation, performing a write operation, etc. The word line driver 116 may apply the voltage output or the pulse to one or more memory cells 125 through a word line WL coupled to the one or more memory cells 125.

The adaptive word line control circuit 118 is a circuit or a component that selectively reduces a voltage output of the word line driver 116. The adaptive word line control circuit 118 may be coupled to an output of the word line driver 116. The adaptive word line control circuit 118 may include two or more diodes connected in series. The adaptive word line control circuit 118 may detect the voltage output of the word line driver 116, and determine whether the voltage output of the word line driver 116 is less than a threshold value. In response to the voltage output of the word line driver 116 exceeding the threshold value, the adaptive word line control circuit 118 can reduce, the voltage output of the word line driver 116. In response to the voltage output of the word line driver 116 not exceeding the threshold value, the adaptive word line control circuit 118 can bypass or omit reducing the voltage output of the word line driver 116. Detailed descriptions on implementations and operations of the adaptive word line control circuit 118 are provided below with respect to FIGS. 2-9.

The control signal generator 130 is a circuit or a component that generates an enable signal to control timing of operation of the adaptive word line control circuit 118. In some embodiments, the control signal generator 130 generates an enable signal that enables the adaptive word line control circuit 118 for a brief time period to selectively reduce the voltage output of the word line driver 116. In one aspect, the word line driver 116 receives a pulse having a first state during a first time period and a second state during a second time period. During a third time period within the first time period, the control signal generator 130 can generate an enable signal to enable the adaptive word line control circuit 118 to reduce a high voltage output of the word line driver 116 exceeding a threshold value. During a fourth time period remaining after the third time period within the first time period, the control signal generator 130 can generate the enable signal to disable the adaptive word line control circuit 118 to not reduce the voltage output of the word line driver 116. Accordingly, a high voltage output from the word line driver 116 can be applied to the memory cell 125 during the fourth time period to help improve the operating speed. In one aspect, a high voltage output can cause a bit flip during the third time period, because a voltage difference in the memory cell 125 may not be large enough. Meanwhile, the high voltage output may not cause the bit flip during the fourth time period, because the voltage difference in the memory cell 125 during the fourth time period may be large enough to overcome or withstand any effect (e.g., capacitive coupling or voltage division) due to the high voltage output. The control signal generator 130 can generate the enable signal to enable the adaptive word line control circuit 118 for a brief time period (e.g., third time period) to prevent a bit flip, and to disable the adaptive word line control circuit 118 after the brief time period (e.g., third time period) to improve operating speed of the memory device 100.

Figure 2:
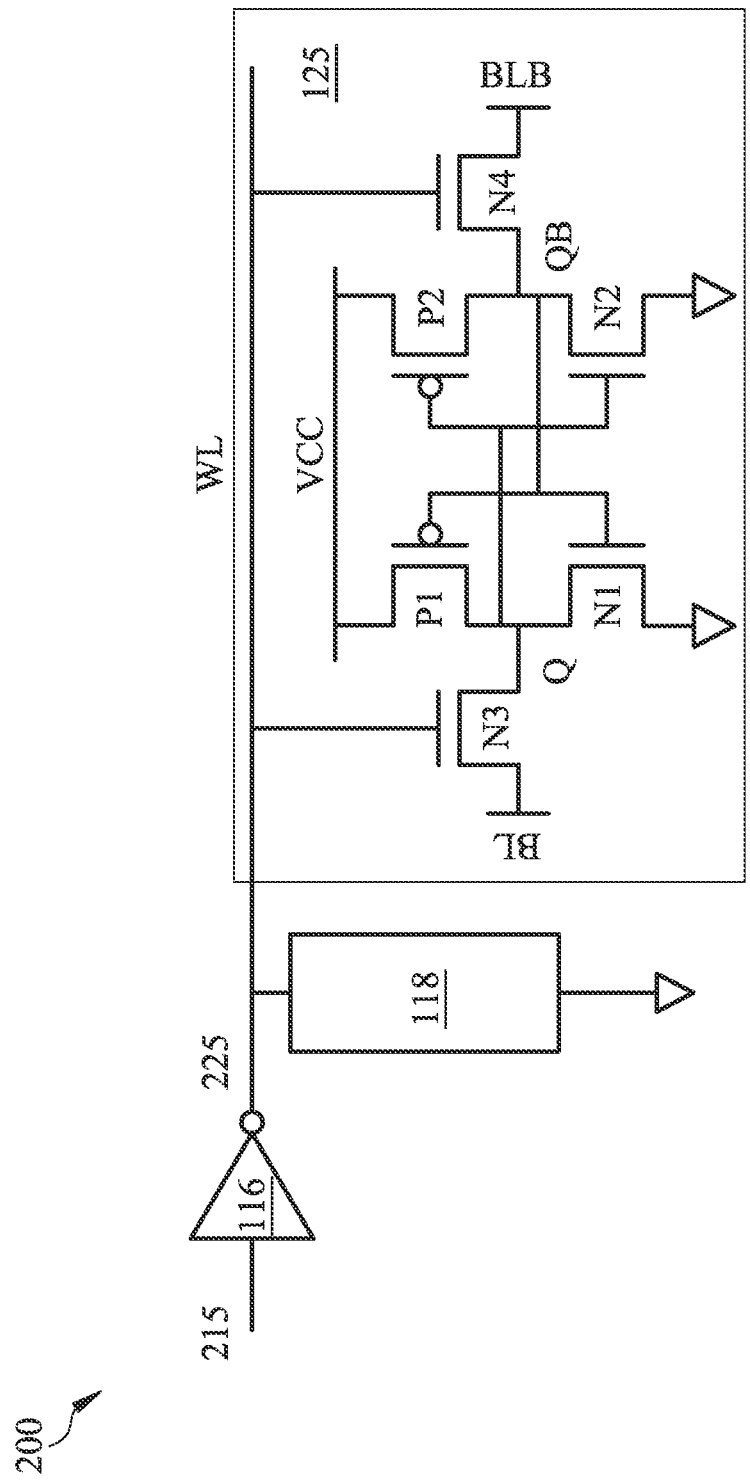
FIG. 2 illustrates a schematic diagram of a word line driver, a memory cell, and an adaptive word line control circuit, in accordance with some embodiments.

FIG. 2 illustrates a schematic diagram of a portion 200 of the memory device 100 including a word line driver 116, a memory cell 125, and an adaptive word line control circuit 118, in accordance with some embodiments. In one configuration, the word line driver 116 is coupled to the memory cell 125 through a word line WL. The word line driver 116 can be implemented as an amplifier or an inverter with a varying supply voltage. The word line driver 116 can receive a voltage input 215 and generate a voltage output 225. The word line driver 116 may apply the voltage output 225 to the memory cell 125 through the word line WL. In one configuration, the adaptive word line control circuit 118 is coupled to the word line WL. The adaptive word line control circuit 118 can selectively adjust or reduce the voltage output 225 to protect the memory cell 125 or prevent a bit flip.

In some embodiments, the memory cell 125 is implemented as a SRAM cell. In some embodiments, the memory cell 125 is embodied as a different type of memory cell. In some embodiments, the memory cell 125 includes an N-type transistors N1, N2, N3, N4 and P-type transistors P1, P2. The N-type transistors N1, N2, N3, N4 may be N-type metal-oxide-semiconductor field-effect transistors (MOSFET) or N-type fin field-effect transistors (FinFET). The P-type transistors P1, P2 may be P-type MOSFET or P-type FinFET. These components may operate together to store data. In other embodiments, the memory cell 125 includes more, fewer, or different components than shown in FIG. 2.

In one configuration, the N-type transistors N3, N4 include gate electrodes coupled to a word line WL. In one configuration, a drain electrode of the N-type transistor N3 is coupled to a bit line BL, and a source electrode of the N-type transistor N3 is coupled to a port Q. In one configuration, a drain electrode of the N-type transistor N4 is coupled to a bit line BLB, and a source electrode of the N-type transistor N4 is coupled to a port QB. In one aspect, the N-type transistors N3, N4 operate as electrical switches. The transistors N3, N4 may allow the bit line BL to electrically couple to or decouple from the port Q and allow the bit line BLB to electrically couple to or decouple from the port QB, according to a voltage applied to the word line WL. For example, according to a supply voltage VCC corresponding to a high state (or logic value '1') applied to the word line WL, the N-type transistor N3 is enabled to electrically couple the bit line BL to the port Q and the N-type transistor N4 is enabled to electrically couple the bit line BLB to the port QB. For another example, according to a ground voltage GND corresponding to a low state (or logic value '0') applied to the word line WL, the N-type transistor N3 is disabled to electrically decouple the bit line BL from the port Q and the N-type transistor N4 is disabled to electrically decouple the bit line BLB from the port QB.

In one configuration, the N-type transistor N1 includes a source electrode coupled to a first supply voltage rail supplying the ground voltage GND, a gate electrode coupled to the port QB, and a drain electrode coupled to the port Q. In one configuration, the P-type transistor P1 includes a source electrode coupled to a second supply voltage rail supplying the supply voltage VCC, a gate electrode coupled to the port QB, and a drain electrode coupled to the port Q. In one configuration, the N-type transistor N2 includes a source electrode coupled to the first supply voltage rail supplying the ground voltage GND, a gate electrode coupled to the port Q, and a drain electrode coupled to the port QB. In one configuration, the P-type transistor P2 includes a source electrode coupled to the second supply voltage rail supplying the supply voltage VCC, a gate electrode coupled to the port Q, and a drain electrode coupled to the port QB. In this configuration, the N-type transistor N1 and the P-type transistor P1 operate as an inverter, and the N-type transistor N2 and the P-type transistor P2 operate as an inverter, such that two inverters form cross-coupled inverters. In one aspect, the cross-coupled inverters may sense and amplify a difference in voltages at the ports Q, QB. When writing data, the cross-coupled inverters may sense voltages at the ports Q, QB provided through the transistors N3, N4 and amplify a difference in voltages at the bit lines BL, BLB. For example, the cross-coupled inverters sense a voltage 0.4 V at the port Q and a voltage 0.5V at the port QB, and amplify a difference in the voltages at the ports Q, QB through a positive feedback (or a regenerative feedback) such that the voltage at the port Q becomes the ground voltage GND (e.g., 0V) and the voltage at the port QB becomes the supply voltage VCC (e.g. 1V).

The amplified voltages at the ports Q, QB may be provided to the bit lines BL, BLB through the transistors N3, N4, respectively for reading. In one approach, the bit lines BL, BLB can be charged to a supply voltage VDD (e.g., 1V), while the transistors N3, N4 are disabled. After pre-charging the bit lines BL, BLB, the transistors N3, N4 can be enabled to discharge the bit lines BL, BLB, according to the programmed states or voltages at the ports Q, QB. According to the programmed states or voltage at the ports Q, QB, a voltage of one of the bit lines BL, BLB may be changed or reduced, while a voltage of the other one of the bit lines BL, BLB may remain unchanged. For example, if the memory cell 125 is programmed such that the voltage at the port Q is the ground voltage GND (e.g., 0V) and the voltage at the port QB is the supply voltage VCC (e.g. 1V), enabling the transistors N3, N4 causes the voltage at the bit line BL to drop while the voltage at the bit line BLB to remain unchanged. By sensing or detecting a voltage difference of the bit lines BL, BLB, a bit stored by the memory cell 125 can be determined.

In one aspect, the adaptive word line control circuit 118 can help improve a stability of operation of the memory device 100 without lowering an operating speed (or reading speed) of the memory device 100. In some embodiments, the adaptive word line control circuit 118 can be replaced by a different component that can perform the functionalities of the adaptive word line control circuit 118 described herein. In one example, a high voltage output 225 from the word line driver 116 above a threshold value (e.g., 0.6~1.0V) may cause a bit flip, and cause error when reading data stored by the memory cell 125. In one implementation, a voltage suppression circuit or an under drive circuit can be implemented to reduce a voltage output 225 of the word line driver 116. However, reducing or suppressing a low voltage output of the word line driver 116 below a threshold value (e.g., 0.6~1.0V) can slow down the operating speed (or reading speed) of the memory device 100. In one aspect, the adaptive word line control circuit 118 can reduce a voltage output 225 of the word line driver 116 for a first voltage range of the voltage output of the word line driver above a threshold value. Meanwhile, the adaptive word line control circuit 118 may not reduce the voltage output 225 of the word line driver 116 for a second voltage range of the voltage output of the word line driver 116 below the threshold value. Accordingly, the stability of the memory device 100 can be improved by reducing the voltage output 225 of the word line driver 116 in the first range. Moreover, an operating speed of the memory device 100 may not be compromised by not reducing the voltage output 225 of the word line driver 116 in the second range.

Figure 3:
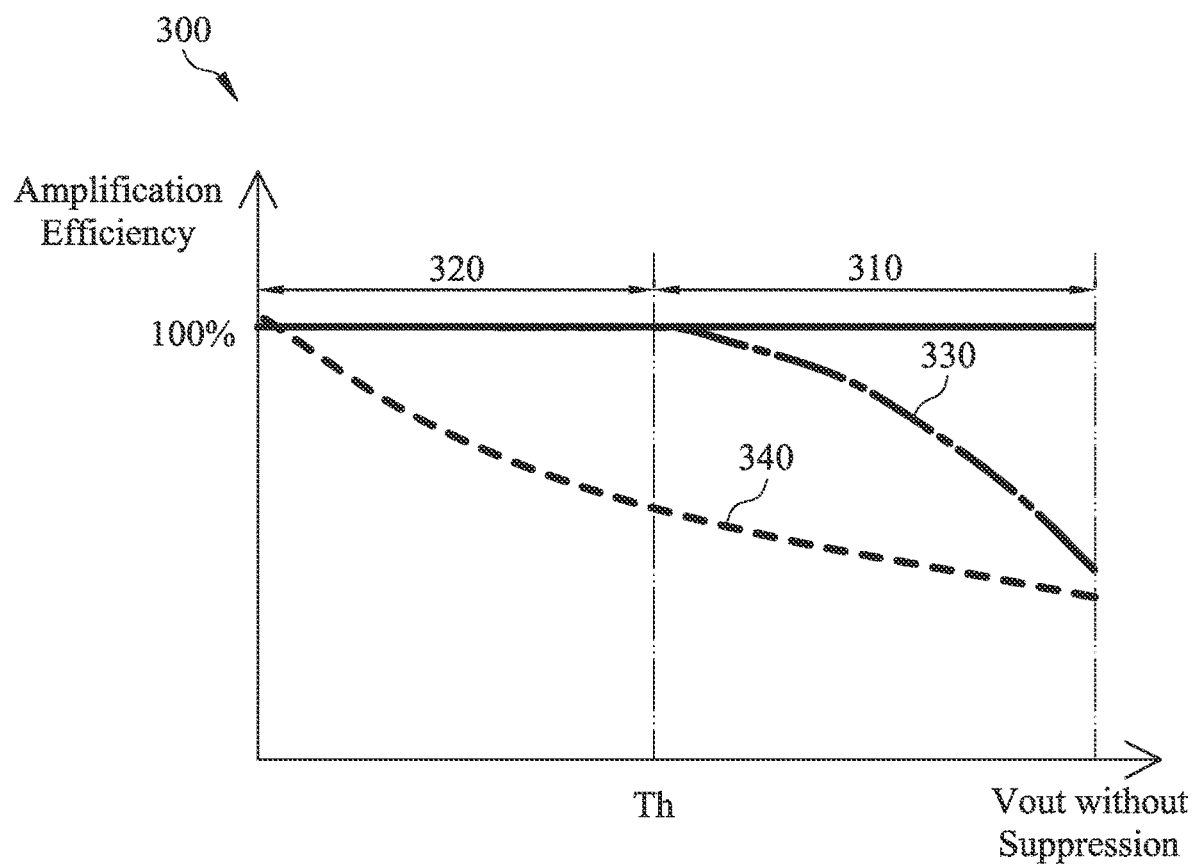
FIG. 3 illustrates a graph of selectively reducing or suppressing a voltage output of a word line driver, in accordance with some embodiments.

FIG. 3 illustrates a graph 300 showing change in suppression applied by the adaptive word line control circuit 118 for different ranges of voltage output 225 of the word line driver 116, in accordance with some embodiments. The X-axis of the graph 300 corresponds to the voltage output 225 of the word line driver 116 without any voltage suppression, which may also correspond to the voltage input 215 of the word line driver 116 multiplied by a voltage gain of the word line driver 116. The Y-axis of the graph 300 corresponds to an amplification efficiency of the word line driver 116.

In one implementation, a voltage suppression circuit or an under drive circuit can be implemented to reduce the voltage output 225 of the word line driver 116 to prevent a bit flip. For example, the voltage suppression circuit can reduce the voltage output 225 for a first range 310, and a second range 320 as shown in a plot 340. The first range 310 may be above a threshold value Th, and the second range 320 may be below the threshold value Th. While reducing the voltage output 225 for the first range 310 may prevent a bit flip, reducing the voltage output 225 for the second range 320 can reduce the operating speed of the memory cell 125.

In one aspect, the adaptive word line control circuit 118 can selectively reduce a voltage output 225 of the word line driver 116 as shown in a plot 330. For example, the adaptive word line control circuit 118 reduces the voltage output 225 of the word line driver 116 for the first range 310 above the threshold value Th to obviate a bit flip. For example, the adaptive word line control circuit 118 can bypass or omit reducing the voltage output of the word line driver 116 for the second range 320 of the voltage output 225 of the word line driver 116 below the threshold voltage Th, such that the operating speed of the memory device 100 may not be degraded.

Figure 4A:
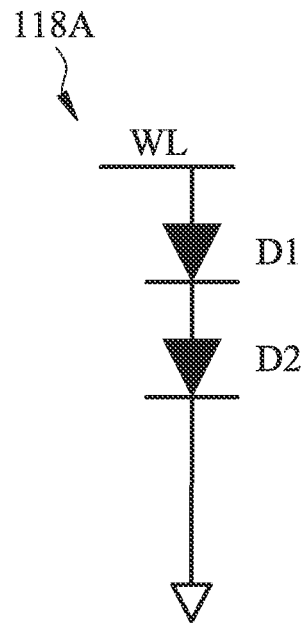
FIGS. 4A-4F illustrate various examples of an adaptive word line control circuit, in accordance with some embodiments.
Figure 4B:
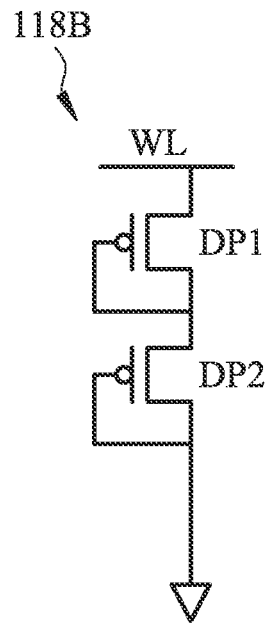
Figure 4C:
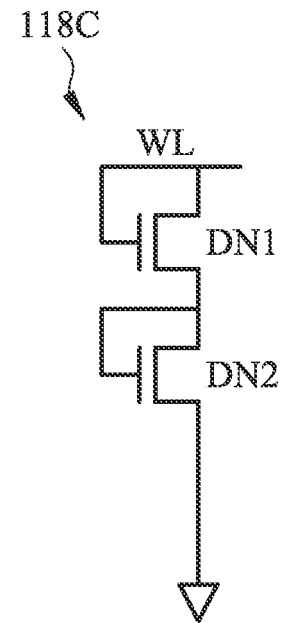
Figure 4D:
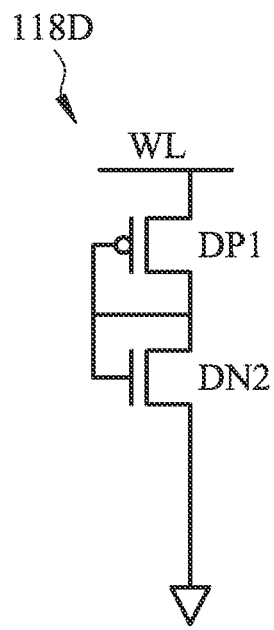
Figure 4E:
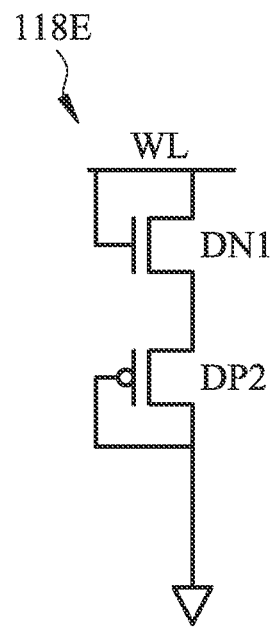
Figure 4F:
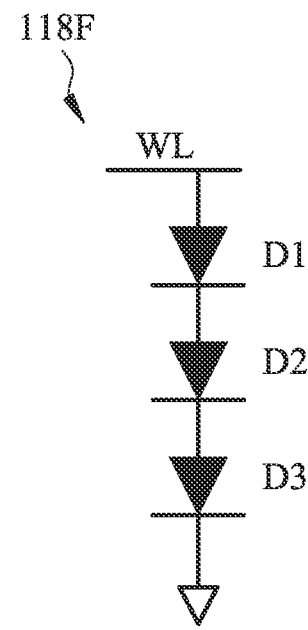

FIGS. 4A-4F illustrate various examples of an adaptive word line control circuit 118, in accordance with some embodiments. Referring to FIG. 4A, an adaptive word line control circuit 118A includes two diodes D1, D2 coupled in series. In some embodiments, the diodes D1, D2 can be replaced by different components that can perform the functions of the adaptive word line control circuit 118 or the diodes D1, D2 described herein. In one configuration, one end of the diode D1 is coupled to the word line WL and another end of the diode D1 is coupled to one end of the diode D2. Another end of the diode D2 may be coupled to a supply voltage rail that provides a ground voltage. The diode D1 may be embodied as an N-type transistor (e.g., DN1) or a P-type transistor (e.g., DP1) with a gate electrode connected to its drain electrode. The diode D2 may be embodied as an N-type transistor (e.g., DN2) or a P-type transistor (e.g., DP2) with a gate electrode connected to its drain electrode. Different configurations or arrangements of adaptive word line control circuits 118B-118E are shown in FIGS. 4B-4E. In some embodiments, the adaptive word line control circuit 118F includes three diodes D1, D2, D3 coupled in series, as shown in FIG. 4F.

In one aspect, the adaptive word line control circuit 118A including the diodes (e.g., D1, D2 or D1, D2, D3) connected in series can selectively reduce the voltage output 225 of the word line driver 116. In one aspect, the threshold value Th may correspond to a sum of threshold voltages of the diodes (e.g., D1, D2 or D1, D2, D3). For example, the diodes (e.g., D1, D2 or D1, D2, D3) may conduct current to reduce the voltage output 225 of the word line driver 116, if the voltage output 225 of the word line driver 116 exceeds a sum of the threshold voltages of the diodes (e.g., D1, D2 or D1, D2, D3). For example, the diodes (e.g., D1, D2 or D1, D2, D3) may not conduct current to omit or bypass reducing the voltage output 225 of the word line driver 116, if the voltage output 225 of the word line driver 116 does not exceed the sum of the threshold voltages of the diodes (e.g., D1, D2 or D1, D2, D3). By implementing the adaptive word line control circuit 118A with the diodes (e.g., D1, D2 or D1, D2, D3) connected in series, the adaptive word line control circuit 118A can be implemented in a simple architecture with a small form factor without a complex feedback circuit or a sensing circuit.

Figure 5A:
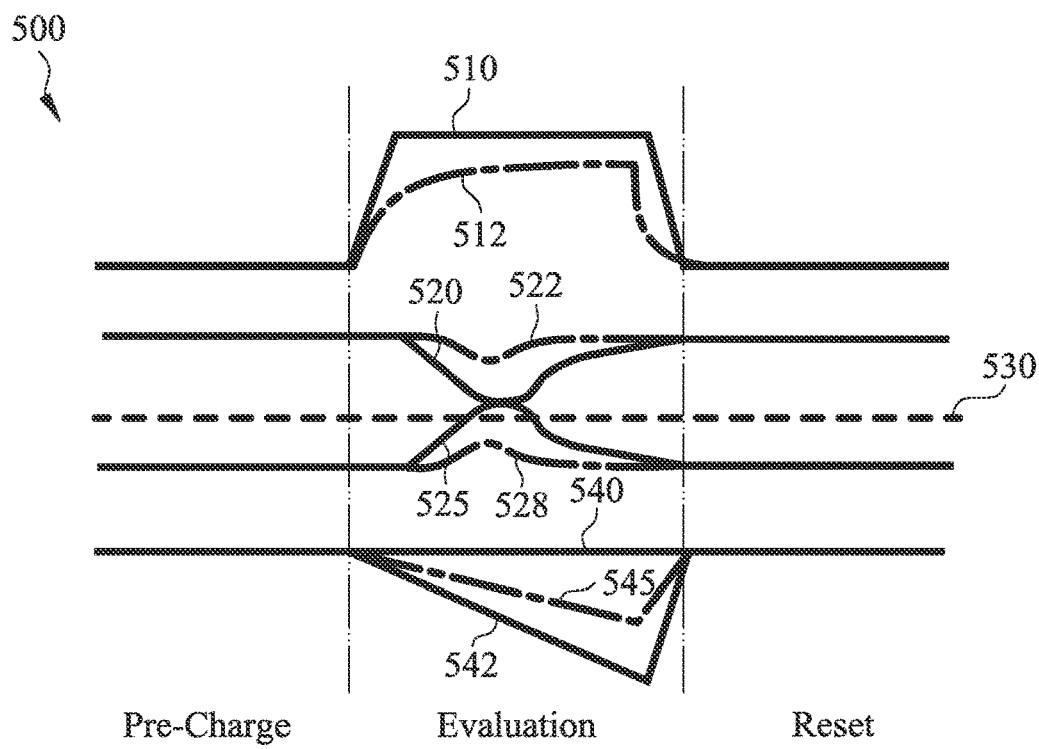
FIG. 5A illustrates a timing diagram showing an operation of a memory device for a first voltage range of an output of a word line driver, in accordance with some embodiments.

FIG. 5A illustrates a timing diagram 500 showing an operation of a memory device 100 for a first range 310 of the voltage output 225 of the word line driver 116, in accordance with some embodiments. The timing diagram 500 includes a plot 510 showing a voltage output 225 of the word line driver 116 without the adaptive word line control circuit 118, and a plot 512 for the voltage output 225 of the word line driver 116 with the adaptive word line control circuit 118. The timing diagram 500 also includes a plot 520 for a voltage at a port QB without the adaptive word line control circuit 118, and a plot 522 for the voltage at the port QB with the adaptive word line control circuit 118. The timing diagram 500 also includes a plot 525 for a voltage at a port Q without the adaptive word line control circuit 118, and a plot 528 for the voltage at the port Q with the adaptive word line control circuit 118. The timing diagram 500 also includes a plot 540 for a voltage at a bit line BLB without the adaptive word line control circuit 118, a plot 542 for the voltage at the bit line BL without the adaptive word line control circuit 118, and a plot 545 for the voltage at the bit line BL with the adaptive word line control circuit 118. In one aspect, the memory device 100 operates in three phases: a pre-charge phase, an evaluation phase, and a reset phase.

In one example shown in FIG. 5A, the memory cell 125 is programmed such that the port Q has a 0V (or ground voltage) and the port QB has a supply voltage (e.g., VCC). During the pre-charge phase, voltages of the bit lines BL, BLB can be pre-charged to the supply voltage (e.g., VCC) by the bit line controller 112. During the pre-charge phase, the voltage output 225 of the word line driver 116 is 0V, such that the transistors N3, N4 may be disabled. By disabling the transistors N3, N4, the bit line BL can be electrically decoupled from the port Q, and the bit line BLB can be electrically decoupled from the port QB.

During the evaluation phase, the word line driver 116 can generate a voltage sufficient to enable the transistors N3, N4. By enabling the transistors N3, N4, the bit line BL can be electrically coupled to the port Q, and the bit line BLB can be electrically coupled to the port QB. Because the voltage of the port QB is the supply voltage (e.g., VCC) in the pre-charge phase, the voltage of the bit line BLB may remain unchanged in the evaluation phase. However, because the voltage of the port Q is 0V (or ground voltage) in the pre-charge phase, the voltage at the bit line BL can decrease in the evaluation phase. Based on the difference in the voltage of the bit line BL and the voltage of the bit line BLB, data stored by the memory cell 125 can be determined.

During the reset phase after the evaluation phase, the voltage output 225 of the word line driver 116 is 0V, such that the transistors N3, N4 may be disabled. By disabling the transistors N3, N4, the bit line BL can be electrically decoupled from the port Q, and the bit line BLB can be electrically decoupled from the port QB. During the reset phase, voltages of the bit lines BL, BLB can be pre-charged to the supply voltage (e.g., VCC) by the bit line controller 112.

In one example, a high voltage output 225 from the word line driver 116 above a threshold value (e.g., 0.6~1.0V) in the evaluation phase may cause a bit flip, and cause error when reading data stored by the memory cell 125. For example, without the adaptive word line control circuit 118, the high voltage output 225 as shown in the plot 510 in the evaluation phase may cause a voltage of the port Q as shown in the plot 525 in the evaluation phase to traverse a flipping point 530 and/or may cause a voltage of the port QB as shown in the plot 520 in the evaluation phase to traverse the flipping point 530, due to capacitive coupling or voltage division. The voltages of the ports Q, QB traversing or crossing the flipping point 530 may cause a bit flip, such that a wrong bit or data can be stored by the memory cell 125.

In one aspect, the adaptive word line control circuit 118 can suppress the voltage output 225 of the word line driver 116 to prevent a bit flip. For example, as shown in the plot 512, the adaptive word line control circuit 118 can suppress or reduce the voltage output 225 in the evaluation phase, because the voltage output 225 exceeds a threshold value Th in the evaluation phase. By reducing or suppressing the voltage output 225, the voltages at the ports Q, QB may not cross the flipping point 530 as shown in the plots 522, 528, such that a bit flip may not occur. In one aspect, reducing the voltage output 225 with the adaptive word line control circuit 118 as shown in the plot 545 may cause the voltage at the bit line BL to be reduced by a less amount or by a lower rate compared to reducing the voltage output 225 without the adaptive word line control circuit 118 as shown in the plot 542. Despite the reduced voltage difference at the bit lines BL, BLB due to the suppression, the high voltage output 225 from the word line driver 116 may be sufficient to ensure sufficient voltage separation between the bit lines BL, BLB in the evaluation phase.

Figure 5B:
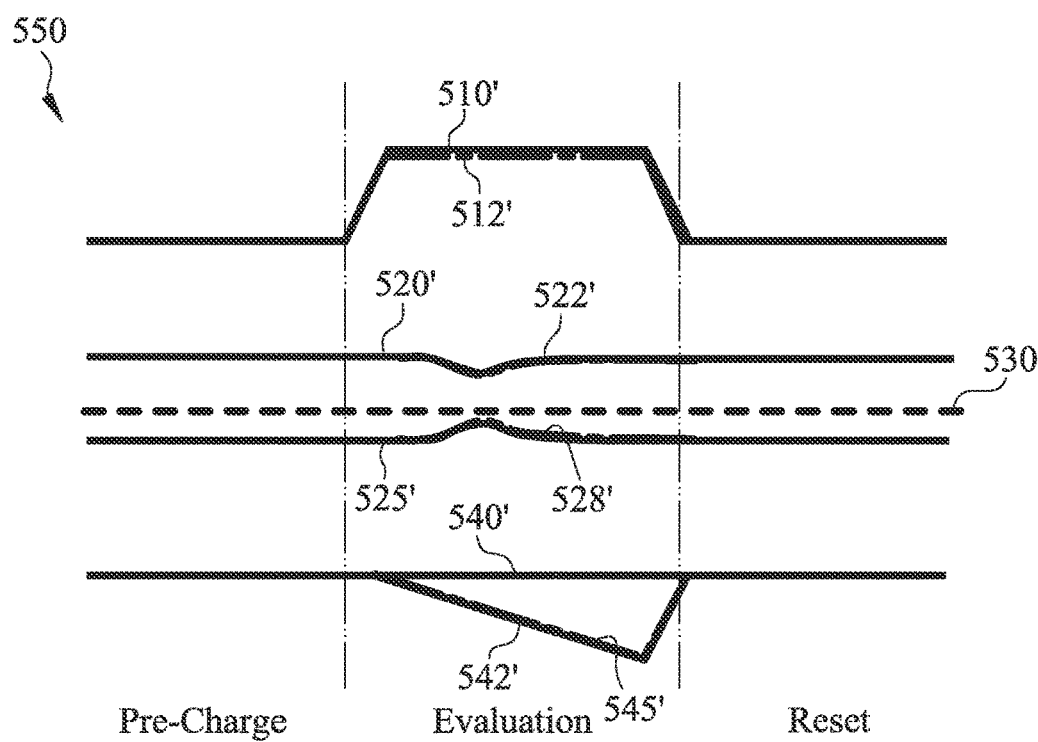
FIG. 5B illustrates a timing diagram showing an operation of a memory device for a second voltage range of the output of the word line driver, in accordance with some embodiments.

FIG. 5B illustrates a timing diagram 550 showing an operation of the memory device 100 for a second range 320 of the voltage output 225 of the word line driver 116, in accordance with some embodiments. The timing diagram 550 includes a plot 510' showing a voltage output 225 of the word line driver 116 without the adaptive word line control circuit 118, and a plot 512' for the voltage output 225 of the word line driver 116 with the adaptive word line control circuit 118. The timing diagram 550 also includes a plot 520' for a voltage at a port QB without the adaptive word line control circuit 118, and a plot 522' for the voltage at the port QB with the adaptive word line control circuit 118. The timing diagram 550 also includes a plot 525' for a voltage at a port Q without the adaptive word line control circuit 118, and a plot 528' for the voltage at the port Q with the adaptive word line control circuit 118. The timing diagram 550 also includes a plot 540' for a voltage at a bit line BLB without the adaptive word line control circuit 118, a plot 542' for the voltage at the bit line BL without the adaptive word line control circuit 118, and a plot 545' for the voltage at the bit line BL with the adaptive word line control circuit 118. In one aspect, the operation of the memory device 100 for the second voltage range 320 is similar to the operation of the memory device 100 for the first voltage range 310 described above with respect to FIG. 5A, except the second range 320 of the voltage output 225 is less than the threshold value Th such that a bit flip may not occur even without the adaptive word line control circuit 118 as shown in the plots 520', 525'. Because the second range 320 of the voltage output 225 less than the threshold value Th may not cause a bit flip, the adaptive bit line control circuit 118 may not reduce or suppress the voltage output 225 of the word line driver 116, such that the plots 512', 522', 528', 545' can match the plots 510', 520', 525', 542', respectively.

In one aspect, reducing or suppressing a low voltage output 225 of the word line driver 116 below a threshold value Th (e.g., 0.6~1.0V) can slow down the operating speed (or reading speed) of the memory device. For example, if the voltage output 225 of the word line driver 116 below the threshold value Th is suppressed, achieving a sufficient voltage difference in the bit lines BL, BLB may take a longer time. Because the low voltage output 225 of the word line driver 116 below the threshold value Th does not cause a bit flip, the adaptive word line control circuit 118 may not reduce the voltage output 225 of the word line driver 116 such that the operating speed (or reading speed) of the memory device 100 may not be lowered.

Advantageously, the stability of the memory device 100 can be improved by selectively reducing the first range 310 of the voltage output 225 of the word line driver 116 as shown in FIG. 5A. Moreover, an operating speed of the memory device 100 may not be compromised by not reducing the second range 320 of the voltage output 225 of the word line driver 116 as shown in FIG. 5B.

Figure 6A:
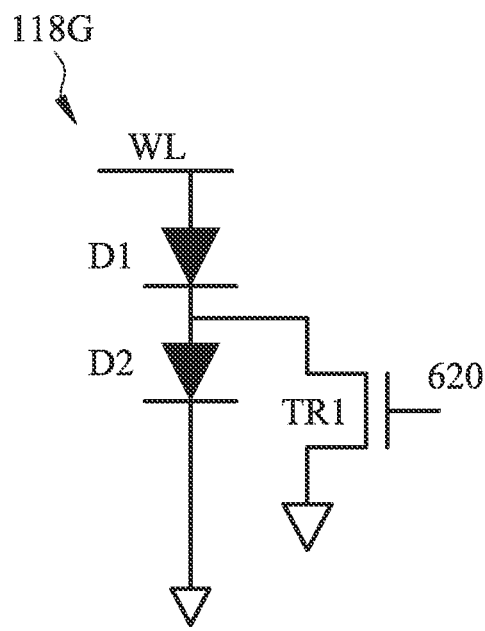
FIGS. 6A-6B illustrate various examples of an adaptive word line control circuit with one or more reset transistors, in accordance with some embodiments.

FIG. 6A illustrates an example of an adaptive word line control circuit 118G with a reset transistor TR1, in accordance with some embodiments. In some embodiments, the adaptive word line control circuit 118G is similar to the adaptive word line control circuit 118A in FIG. 4A, except the reset transistor TR1 is coupled to a node between the diodes D1, D2. Thus, detailed description of duplicated portion thereof is omitted herein for the sake of brevity.

In one aspect, the reset transistor TR1 is implemented to reset or discharge the node between the diodes D1, D2. In some embodiments, the reset transistor TR1 can be replaced by a different component that can perform the functionalities of the reset transistor TR1 described herein. In some embodiments, the reset transistor TR1 is implemented as an N-type transistor. In some embodiments, the reset transistor TR1 is implemented as a P-type transistor. In one configuration, the reset transistor TR1 includes a drain electrode coupled to the node between the diodes D1, D2, a source electrode coupled to a supply voltage rail to receive a supply voltage (e.g., ground voltage), and a gate electrode to receive a control signal 620. The control signal 620 may be the voltage input 215 of the word line driver 116 or a separate control signal generated by the control signal generator 130. In one aspect, the control signal 620 may have a high state (or 1V) when the voltage output 225 of the word line driver 116 has a low state (e.g., 0V). In addition, the control signal 620 may have a low state (or 0V) when the voltage output 225 of the word line driver 116 has a high state (e.g., 0.5~1.2V). Accordingly, when the voltage output 225 of the word line driver 116 has the low state (e.g., 0V), the reset transistor TR1 can be enabled to electrically couple the node between the diodes D1, D2 to the supply voltage rail providing a ground voltage to discharge the node. When the voltage output 225 of the word line driver 116 has the high state (e.g., 0.5~1.2V), the reset transistor TR1 can be disabled to electrically decouple the node between the diodes D1, D2 from the supply voltage rail to not discharge the node. By discharging the node between the diodes D1, D2 through the reset transistor TR1, the adaptive word line control circuit 118G can operate in a reliable manner.

Figure 6B:
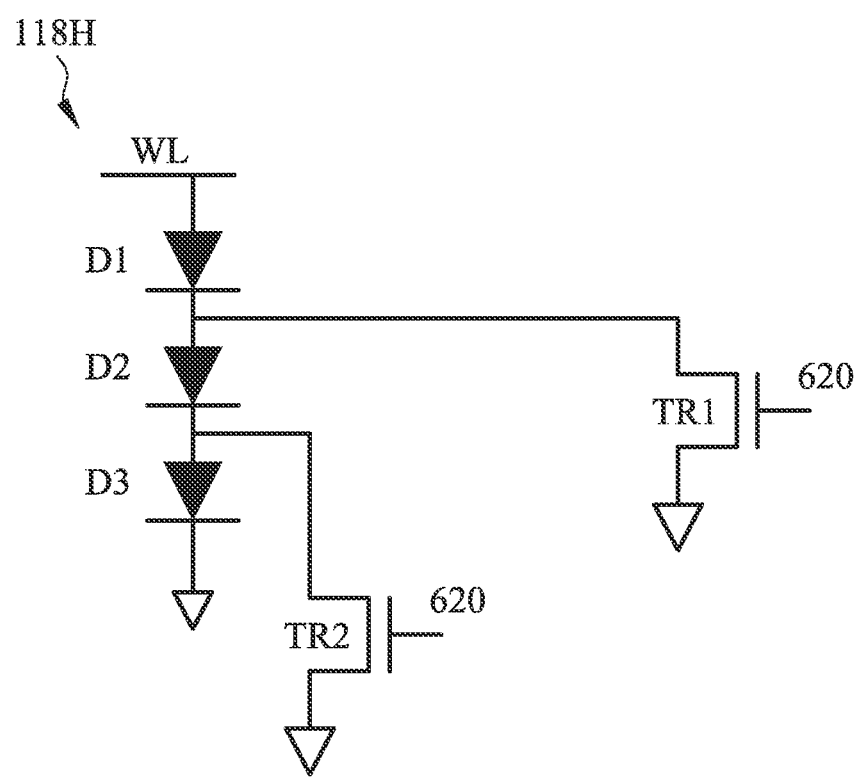

FIG. 6B illustrates an example of an adaptive word line control circuit 118H with reset transistors TR1, TR2, in accordance with some embodiments. In some embodiments, the adaptive word line control circuit 118H is similar to the adaptive word line control circuit 118F in FIG. 4F, except the reset transistor TR1 is coupled to a node between the diodes D1, D2, and the reset transistor TR2 is coupled to a node between the diodes D2, D3. Thus, detailed description of duplicated portion thereof is omitted herein for the sake of brevity. The reset transistor TR2 can be implemented to discharge the node between the diodes D2, D3 in a similar manner as the transistor TR1 discharging the node between the diodes D1, D2.

Figure 7A:
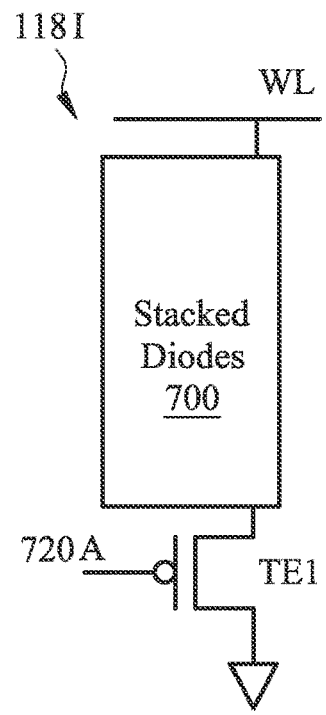
FIGS. 7A-7B illustrate various examples of an adaptive word line control circuit with an enable switch, in accordance with some embodiments.

FIG. 7A illustrates an example of an adaptive word line control circuit 118I with an enable switch TE1, in accordance with some embodiments. In some embodiments, the adaptive word line control circuit 118I includes stacked diodes 700 coupled to the word line WL. The stacked diodes 700 may include two or more diodes (e.g., D1, D2 or D1, D2, D3) coupled to each other in series as shown in FIG. 4A or 4F, except an end of a diode is connected to the enable switch TE1 instead of the supply voltage rail to receive the ground voltage, such that the enable switch TE1 and the stacked diodes 700 can be connected in series.

The enable switch TE1 is a circuit to enable or disable operation of adaptive word line control circuit 118I. In some embodiments, the enable switch TE1 can be replaced by a different component that can perform the functionalities of the enable transistor TE1 described herein. In some embodiments, the enable switch TE1 is embodied as a P-type transistor as shown in FIG. 7A. In one configuration, the enable switch TE1 includes a source electrode coupled to the stacked diodes 700, a drain electrode coupled to a supply voltage rail to receive a supply voltage (e.g., ground voltage), and a gate electrode to receive an enable signal 720A. The enable signal 720A may be the voltage input 215 of the word line driver 116 or a separate control signal generated by the control signal generator 130. In one aspect, the enable signal 720A may have a high state (or 1V) when the voltage output 225 of the word line driver 116 has a low state (e.g., 0V). In addition, the enable signal 720A may have a low state (or 0V) when the voltage output 225 of the word line driver 116 has a high state (e.g., 0.5~1.2V). Accordingly, when the voltage output 225 of the word line driver 116 has the low state (e.g., 0V), the enable transistor TE1 can be disabled to prevent current flow through the stacked diodes 700. When the voltage output 225 of the word line driver 116 has the high state (e.g., 0.5~1.2V), the enable transistor TE1 can be enabled to allow current flow through the stacked diodes 700. In one aspect, the enable signal 720A enables the stacked diodes 700 or the adaptive word line control circuit 118I for a brief time period to improve operating speed (e.g., reading speed) of the memory device 100, as described below with respect to FIG. 7C.

Figure 7B:
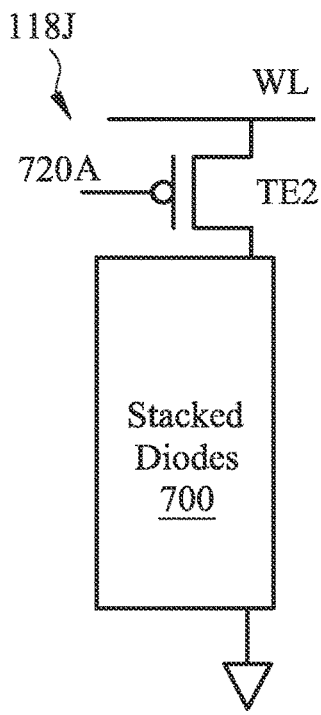

FIG. 7B illustrates an example of an adaptive word line control circuit 118J with an enable switch TE2, in accordance with some embodiments. In some embodiments, the adaptive word line control circuit 118J includes the stacked diodes 700 and the enable switch TE2 coupled in series to the word line WL. The configuration of the adaptive word line control circuit 118J is similar to the adaptive word line control circuit 118I, except the enable transistor TE1 is omitted, the enable transistor TE2 is coupled between the stacked diodes 700 and the word line WL, and an end of a diode of the stacked diodes 700 is connected to the supply voltage rail to receive the ground voltage. Thus, detailed description of duplicated portion thereof is omitted herein for the sake of brevity. The enable transistor TE2 may be embodied as a P-type transistor. The enable transistor TE2 may operate according to the enable signal 720A, in a similar manner as the enable transistor TE1.

Figure 7C:
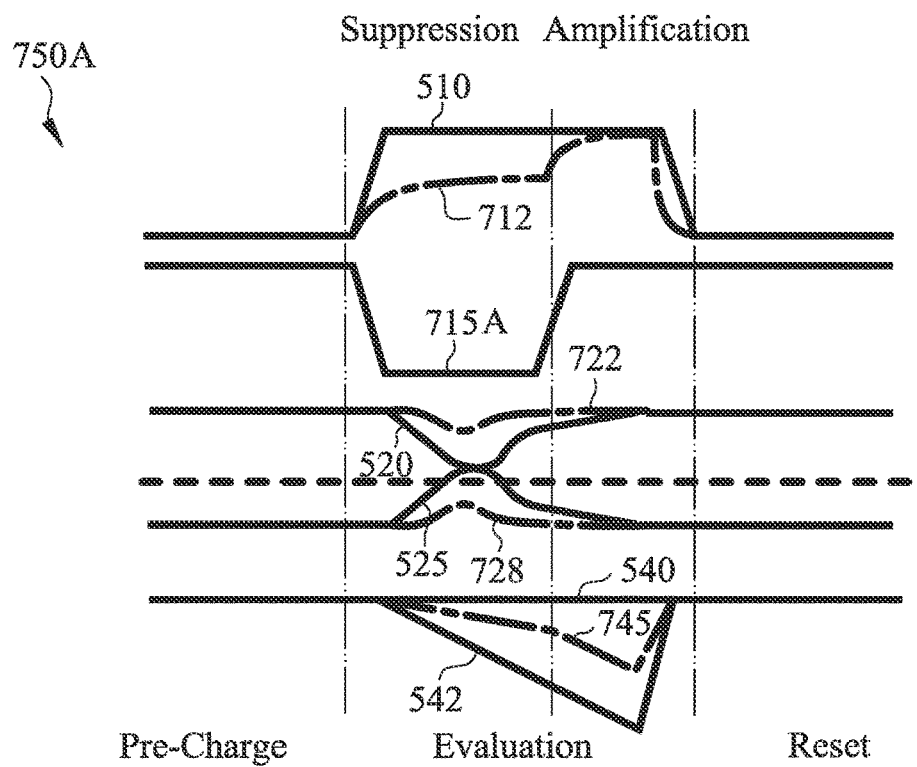
FIG. 7C illustrates a timing diagram showing an operation of a memory device, in accordance with some embodiments.

FIG. 7C illustrates a timing diagram 750A showing an operation of a memory device 100, in accordance with some embodiments. The memory device 100 may operate as shown in the timing diagram 750A for a first range 310 of voltage output 225 of the word line driver 116. The timing diagram 750A includes a plot 510 showing a voltage output 225 of the word line driver 116 without the adaptive word line control circuit 118, and a plot 712 for the voltage output 225 of the word line driver 116 with the adaptive word line control circuit 118. The timing diagram 750A includes a plot 715A showing the enable signal 720A to control the enable switch TE1 or TE2 implemented as a P-type transistor. The timing diagram 750A also includes a plot 520 for a voltage at a port QB without the adaptive word line control circuit 118, and a plot 722 for the voltage at the port QB with the adaptive word line control circuit 118. The timing diagram 750A also includes a plot 525 for a voltage at a port Q without the adaptive word line control circuit 118, and a plot 728 for the voltage at the port Q with the adaptive word line control circuit 118. The timing diagram 750A also includes a plot 540 for a voltage at a bit line BLB without the adaptive word line control circuit 118, a plot 542 for the voltage at the bit line BL without the adaptive word line control circuit 118, and a plot 745 for the voltage at the bit line BL with the adaptive word line control circuit 118. In some embodiments, the memory device 100 operates in three phases: a pre-charge phase, an evaluation phase, and a reset phase, where the evaluation phase is divided into a suppression phase and an amplification phase. The operations of the memory device 100 in the pre-charge phase and the reset phase are identical to ones described in FIG. 5A. Thus, detailed description on duplicated portion thereof is omitted herein for the sake of brevity.

During the suppression phase, the enable signal 720A may have a low state (or 0V) to enable the adaptive word line control circuit 118 (e.g., 118I or 118J). The suppression phase may be performed during a brief time period within a time period for the evaluation phase. During the suppression phase, the memory device 100 may operate in a similar manner a corresponding time period of the evaluation phase in FIG. 5A, such that portions of the plots 712, 722, 728, 745 in the suppression phase may be the same as corresponding portions of the plots 512, 522, 528, 545, respectively.

During the amplification phase, the enable signal 720A may have a high state (or VCC) to disable the adaptive word line control circuit 118. The amplification phase may be performed during a remaining time period within the time period for the evaluation phase, after the brief time period for the suppression phase. In one aspect, by disabling the adaptive word line control circuit 118 during the amplification phase, the voltage output 225 of the word line driver 116 can be increased, for example, to a supply voltage (e.g., VCC) as shown in the plot 712. By applying the high voltage or supply voltage in the amplification phase, the voltage at the bit line BL can be discharged faster as shown in the plot 745. Discharging the bit line BL at a higher rate can reduce a time for the voltage separation of the voltages at the bit lines BL, BLB to reach a sufficient level to read data stored by the memory cell 125.

Advantageously, the adaptive word line control circuit 118I, 118J can help improve stability of the memory device 100 without compromising the operating speed (e.g., reading speed) of the memory device 100. In one aspect, reducing or suppressing the voltage output 225 of the word line driver 116 can help avoid a bit flip and improve stability, but reducing the voltage output 225 of the word line driver 116 may lower the operating speed of the memory device 100. By applying a high voltage (e.g., VCC) to the memory cell 125 during the amplification phase, the voltage at the bit line BL or BLB can be discharged or reduced at a faster rate to improve reading speed. In one aspect, after the suppression phase, the voltage difference in the memory cell 125 may be large enough to overcome or withstand any effect (e.g., capacitive coupling or voltage division) due to the high voltage (e.g., VCC) output by the word line driver 116, such that the bit flip may not occur during the amplification phase. Therefore, the adaptive word line control circuit can be enabled for a brief time period corresponding to the suppression phase to prevent a bit flip, and disabled after the brief time period to improve operating speed of the memory device 100.

Figure 7D:
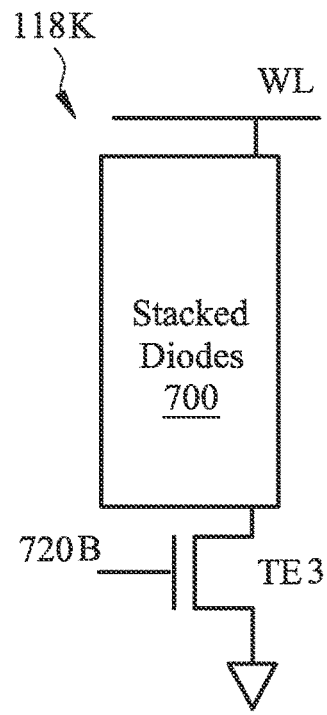
FIGS. 7D-7E illustrate various examples of an adaptive word line control circuit with an enable switch, in accordance with some embodiments.

FIG. 7D illustrates an example of an adaptive word line control circuit 118K with an enable switch TE3, in accordance with some embodiments. The adaptive word line control circuit 118K is similar to the adaptive word line control circuit 118I shown in FIG. 7A, except the enable switch TE1 is replaced with an enable switch TE3, and the enable switch TE3 receives an enable signal 720B instead of the enable signal 720A. Thus, detailed description of duplicated portion thereof is omitted herein for the sake of brevity. In one aspect, the enable switch TE3 is embodied as an N-type transistor. In one aspect, the enable signal 720B may have an inverted phase of the enable signal 720A.

Figure 7E:
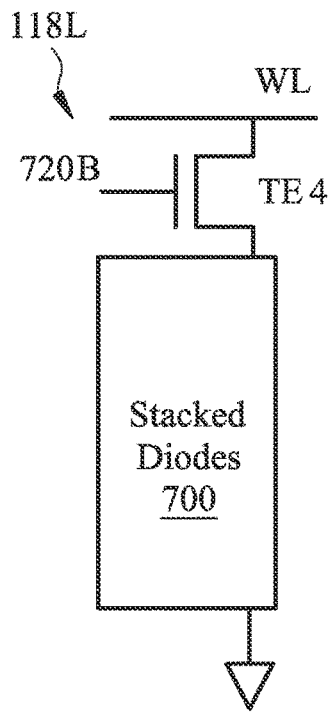

FIG. 7E illustrates an example of an adaptive word line control circuit 118L with an enable switch TE4, in accordance with some embodiments. The adaptive word line control circuit 118L is similar to the adaptive word line control circuit 118J shown in FIG. 7B, except the enable switch TE2 is replaced with an enable switch TE4, and the enable switch TE4 receives an enable signal 720B instead of the enable signal 720A. Thus, detailed description of duplicated portion thereof is omitted herein for the sake of brevity. In one aspect, the enable switch TE4 is embodied as an N-type transistor.

Figure 7F:
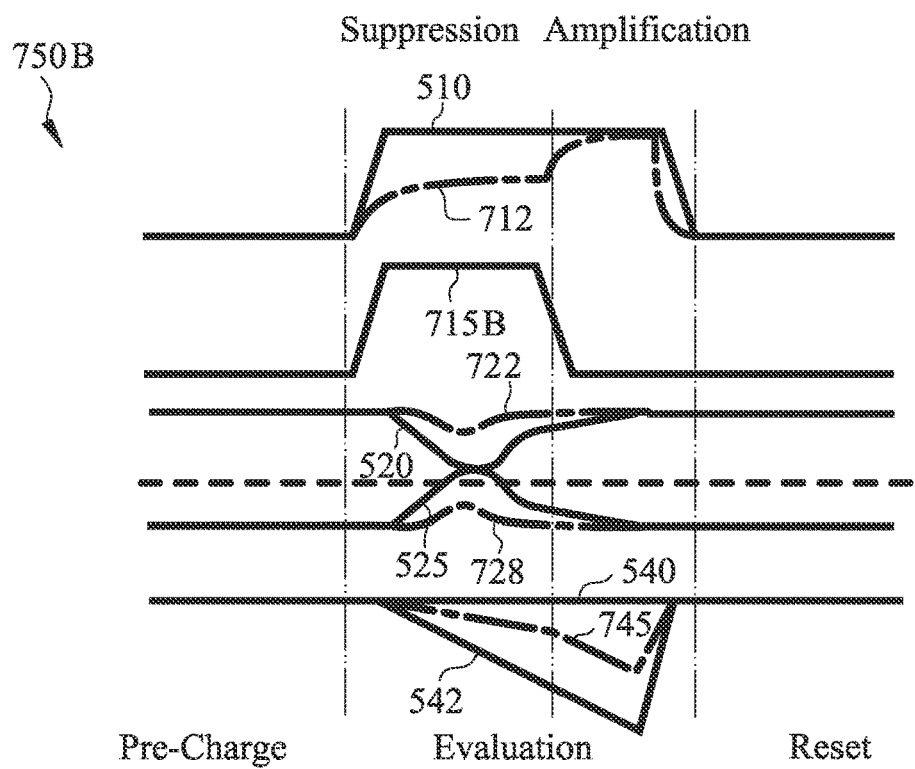
FIG. 7F illustrates a timing diagram showing an operation of a memory device, in accordance with some embodiments.

FIG. 7F illustrates a timing diagram 750B showing an operation of a memory device 100, in accordance with some embodiments. The timing diagram 750B is similar to the timing diagram 750A in FIG. 7C, except the plot 715B showing the enable signal 720B to control the enable switch TE3 or TE4 has an inverted phase of the plot 715A. Thus, detailed description of duplicated portion thereof is omitted herein for the sake of brevity.

FIG. 8 is a flowchart showing a method 800 of adaptively adjusting a voltage output 225 of a word line driver 116, in accordance with some embodiments. In some embodiments, the method 800 is performed by an adaptive word line control circuit (e.g., adaptive word line control circuit 118). In some embodiments, the method 800 is performed by other entities. In some embodiments, the method 800 includes more, fewer, or different steps than shown in FIG. 8.

In one approach, the adaptive word line control circuit detects 810 a voltage output (e.g., voltage output 225) of a word line driver (e.g., word line driver 116) coupled to a memory cell (e.g., memory cell 125) through a word line (e.g., word line WL). The memory cell may be a SRAM cell, or any memory cell. The word line driver may generate a voltage or a pulse and apply the voltage or pulse to word line to write data to the memory cell 125 or read data from the memory cell 125.

In one approach, the adaptive word line control circuit determines 820 whether the voltage output exceeds a threshold value (e.g., Th). In one aspect, the adaptive word line control circuit includes two or more diodes (e.g., diodes D1, D2) stacked or connected in series, where one of the two or more diodes is connected to the word line. The diodes may be embodied as N-type transistors, P-type transistors, or a combination of N-type transistors and P-type transistors, where each transistor includes a gate electrode connected to its drain electrode. In this configuration, the threshold value may correspond to a sum of threshold voltages of the two or more diodes. By implementing the adaptive word line control circuit with two or more diodes connected in series, the adaptive word line control circuit can be implemented in a simple architecture with a small form factor without a complex feedback circuit or a sensing circuit.

In one approach, the adaptive word line control circuit selectively reduces 830 the voltage output of the word line driver, according to the determination. The adaptive word line control circuit may reduce a voltage output of the word line driver for a first range of the voltage output of the word line driver higher than the threshold value, and may bypass or omit reducing the voltage output of the word line driver for a second range of the voltage output of the word line driver lower than the threshold value. For example, if the voltage output of the word line driver exceeds the threshold value, the two or more diodes can conduct current to reduce the voltage output. For example, if the voltage output of the word line driver does not exceed the threshold value, the two or more diodes may not conduct current, such that the voltage output may not be reduced.

Advantageously, the disclosed adaptive word line control circuit 118 can help improve a stability of operation of the memory device 100 without lowering an operating speed (or reading speed) of the memory device 100. In one example, a high voltage output from the word line driver 116 above a threshold value (e.g., 0.6~1.0V) may cause a bit flip, and cause error when reading data stored by the memory cell 125. In one implementation, a voltage suppression circuit or an under drive circuit can be implemented to reduce a voltage output of the word line driver 116. However, reducing or suppressing a low voltage output 225 of the word line driver 116 below a threshold value (e.g., 0.6~1.0V) can slow down the operating speed (or reading speed) of the memory device 100. In one aspect, the adaptive word line control circuit 118 can selectively reduce a voltage output 225 of the word line driver 116, such that a bit flip due to the high voltage output 225 of the word line driver 116 exceeding the threshold value can be obviated without compromising or slowing the operating speed of the memory device 100 for the low voltage output 225 of the word line driver 116 below the threshold value.

In one aspect, the adaptive word line control circuit 118 can selectively reduce the voltage output 225 of the word line driver 116 for a brief time period to improve the operating speed (e.g., reading speed) of the memory device 100. Reducing the voltage output 225 of the word line driver 116 can help improve stability of the memory device 100, but may lower the operating speed of the memory device 100. In one aspect, the word line driver 116 receives a pulse having a first state (e.g., 0V) during a first time period (e.g., evaluation phase) and a second state (e.g., VCC) during a second time period (e.g., pre-charge phase or reset phase). The adaptive word line control circuit 118 can be enabled during a third time period within the first time period (e.g., evaluation phase) to reduce the voltage output 225 of the word line driver 116 during the third time period (e.g., suppression phase). During a fourth time period (e.g., amplification phase) remaining after the third time period within the first time period, the adaptive word line control circuit 118 can be disabled to not reduce the voltage output 225 of the word line driver 116. Applying the voltage output 225 without reduction may allow the memory device 100 to operate faster. Accordingly, a high voltage output 225 from the word line driver 116 can be applied to the memory cell 125 during the fourth time period (e.g., amplification phase) to help improve the operating speed.

Figure 9:
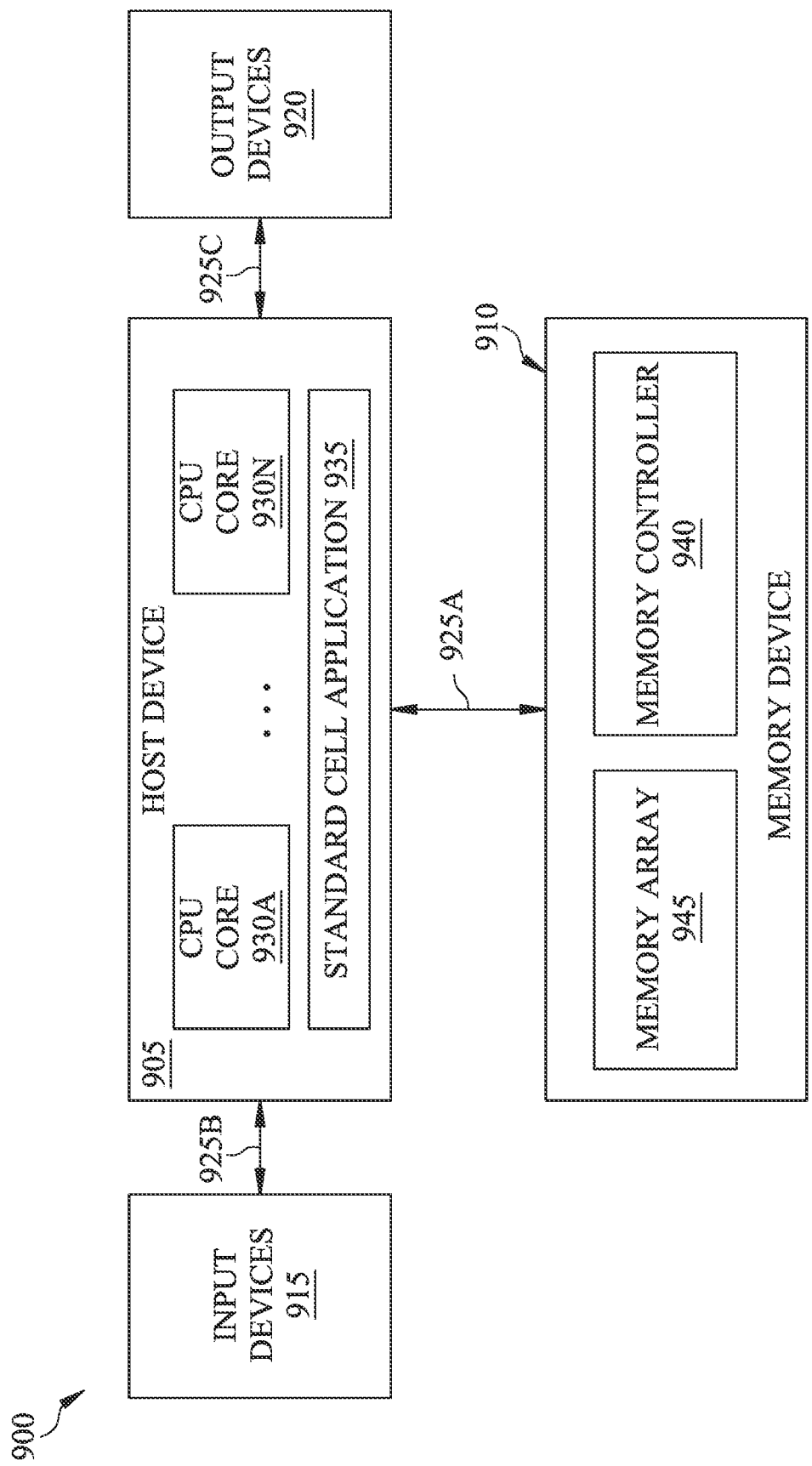
FIG. 9 is an example block diagram of a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device and send instructions to the host device. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A-930N. The CPU cores 930A-930N may be implemented as an Application Specific Integrated Circuit ("ASIC"), Field Programmable Gate Array ("FPGA"), or any other type of processing unit. Each of the CPU cores 930A-930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a standard cell application 935. The standard cell application 935 may be part of a computer aided design or electronic design automation software suite that may be used by a user of the host device 905 to use, create, or modify a standard cell of a circuit. In some embodiments, the instructions to execute or run the standard cell application 935 may be stored within the memory device 910. The standard cell application 935 may be executed by one or more of the CPU cores 930A-930N using the instructions associated with the standard cell application from the memory device 910. In one example, the standard cell application 935 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100, the memory controller 105, the word line controller 114, the adaptive word line control circuit 118, or any portion of the memory device 100 can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array in response to instructions received from the host device 905. Although shown as being part of the memory device 910, in some embodiments, the memory controller 940 may be part of the host device 905 or part of another component of the computing system 900 and associated with the memory device 910. The memory controller 940 may be implemented as a logic circuit in either software, hardware, firmware, or combination thereof to perform the functions described herein. For example, in some embodiments, the memory controller 940 may be configured to retrieve the instructions associated with the standard cell application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

In one aspect of the present disclosure, a memory device is disclosed. In some embodiments, the memory device includes a memory cell, and a word line driver coupled to the memory cell through a word line. In some embodiments, the memory device includes an adaptive word line control circuit including two or more diodes connected in series, where one of the two or more diodes is coupled to the word line.

In another aspect of the present disclosure, a memory device is disclosed. In some embodiments, the memory device includes a memory cell, and a word line driver coupled to the memory cell. In some embodiments, the memory device includes an adaptive word line control circuit to reduce a voltage output of the word line driver for a first voltage range, and bypass reducing the voltage output of the word line driver for a second voltage range.

In yet another aspect of the present disclosure, a method of operating a memory device is disclosed. In some embodiments, the method includes detecting, by an adaptive word line control circuit, a voltage output of a word line driver coupled to a SRAM cell. In some embodiments, the method includes determining, by the adaptive word line control circuit, whether the voltage output of the word line driver is less than a threshold value. In some embodiments, the method includes reducing, by the adaptive word line control circuit, the voltage output of the word line driver, in response to the voltage output of the word line driver exceeding the threshold value.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a memory cell;
   a word line driver coupled to the memory cell through a word line; and
   an adaptive word line control circuit including two or more diodes connected in series, one of the two or more diodes coupled to the word line,
   wherein the adaptive word line control circuit includes a reset transistor coupled to a node between a first diode of the two or more diodes and a second diode of the two or more diodes, the reset transistor to reset a voltage at the node when the adaptive word line control circuit is disabled.

2. The memory device of claim 1, wherein the memory cell is a static random access memory (SRAM) cell.

3. A memory device comprising:
   a memory cell;
   a word line driver coupled to the memory cell through a word line; and
   an adaptive word line control circuit including two or more diodes connected in series, one of the two or more diodes coupled to the word line;
   wherein the adaptive word line control circuit is configured to:
      reduce a voltage output of the word line driver for a first voltage range, and
      bypass reducing the voltage output of the word line driver for a second voltage range,
   wherein the adaptive word line control circuit includes a reset transistor coupled to a node between a first diode of the two or more diodes and a second diode of the two or more diodes, the reset transistor to reset a voltage at the node when the adaptive word line control circuit is disabled.

4. The memory device of claim 3, wherein the memory cell is a static random access memory (SRAM) cell.

5. A memory device comprising:
   a static random access memory (SRAM) cell;
   a word line driver coupled to the SRAM cell through a word line; and
   an adaptive word line control circuit including two or more diodes connected in series, one of the two or more diodes coupled to the word line, wherein the adaptive word line control circuit includes a reset transistor coupled to a node between a first diode of the two or more diodes and a second diode of the two or more diodes, the reset transistor to reset a voltage at the node when the adaptive word line control circuit is disabled;
   wherein the adaptive word line control circuit is configured to:
      reduce a voltage output of the word line driver for a first voltage range, and
      bypass reducing the voltage output of the word line driver for a second voltage range.

6. The memory device of claim 5, wherein the reset transistor is implemented as a n-type transistor.

7. The memory device of claim 5, wherein the reset transistor is disabled to electrically decouple the node between the first diode of the two or more diodes and the second diode of the two or more diodes.

8. The memory device of claim 5, wherein the reset transistor includes a drain electrode coupled to the node between the first diode of the two or more diodes and the second diode of the two or more diodes.

* * * * *